US011922737B2

(12) United States Patent
Salter et al.

(10) Patent No.: US 11,922,737 B2
(45) Date of Patent: Mar. 5, 2024

(54) SYSTEM AND METHOD FOR A PURCHASE ADVISOR FOR PREOWNED BATTERY ELECTRIC VEHICLES (BEVS)

(71) Applicant: Ford Global Technologies, LLC, Dearborn, MI (US)

(72) Inventors: Stuart Salter, White Lake, MI (US); Pietro Buttolo, Dearborn Heights, MI (US); Annette Huebner, Highland, MI (US); David Kennedy, Canton, MI (US); Hussein Berry, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 286 days.

(21) Appl. No.: 17/540,930

(22) Filed: Dec. 2, 2021

(65) Prior Publication Data

US 2023/0177890 A1 Jun. 8, 2023

(51) Int. Cl.
*G07C 5/04* (2006.01)
*B60L 58/16* (2019.01)
*G06F 30/20* (2020.01)
*G06Q 30/0601* (2023.01)
*G07C 5/08* (2006.01)
*H01M 10/48* (2006.01)

(52) U.S. Cl.
CPC ............. *G07C 5/04* (2013.01); *B60L 58/16* (2019.02); *G06F 30/20* (2020.01); *G06Q 30/0613* (2013.01); *G07C 5/0816* (2013.01); *H01M 10/48* (2013.01); *H01M 2220/20* (2013.01)

(58) Field of Classification Search
CPC .......... G01C 5/04; G01C 5/0816; G06F 30/20; B60L 58/16; H01M 10/48
See application file for complete search history.

(56) References Cited

U.S. PATENT DOCUMENTS 10,345,383 B2  7/2019  Mullen et al.
10,598,734 B2  3/2020  Newman et al.
(Continued)

FOREIGN PATENT DOCUMENTS

CN  107719143 A  2/2018
CN  111164440 A  5/2020

OTHER PUBLICATIONS

Nassim Noura et al., A Review of Battery State of Health Estimation Methods: Hybrid Electric Vehicle Challenges, World Electric Vehicle Journal, MDPI, Oct. 16, 2020, 1-20.

*Primary Examiner* — Tan Q Nguyen
(74) *Attorney, Agent, or Firm* — Brandon Hicks; Eversheds Sutherland (US) LLP

(57) ABSTRACT

The disclosure is generally directed to systems and methods for battery life cycle prediction for a preowned electrified vehicle including receiving state of charge (SOC) and mileage data associated with the preowned electrified vehicle, providing one or more driving maneuvers to be performed by a driver, providing one or more instructions to the driver to operate power-driven accessories of the preowned electrified vehicle, collecting data representing battery usage by the driver by monitoring the driving maneuvers and the operation of power-driven accessories as performed by the driver, and responsive to the collected data representing battery usage and the SOC and mileage, providing a battery life prediction for the preowned electrified vehicle.

20 Claims, 5 Drawing Sheets

(56) References Cited

U.S. PATENT DOCUMENTS

| | | | |
|---|---|---|---|
| 2018/0143257 A1* | 5/2018 | Garcia | G01R 31/382 |
| 2021/0293890 A1* | 9/2021 | Gorrachategui | G01R 31/367 |
| 2022/0137149 A1* | 5/2022 | Chueh | B60L 58/12 |
| | | | 702/63 |
| 2023/0010868 A1* | 1/2023 | Mendes | B60L 3/12 |

* cited by examiner

SYSTEM AND METHOD FOR A PURCHASE ADVISOR FOR PREOWNED BATTERY ELECTRIC VEHICLES (BEVS)

FIELD

This disclosure generally relates to preowned battery electric vehicles (BEVs), and more particularly relates to systems and methods for predicting remaining battery life on a preowned BEV vehicle.

BACKGROUND

With battery electric vehicles (BEVs) entering into the mainstream, including hybrid electric vehicles and plug-in type vehicles, preowned BEVs are becoming more available. Unlike a gasoline-powered vehicle, the mileage on a preowned BEV is not the paramount characteristic determinative of longevity of the vehicle. Instead, in some instances, the batteries in a preowned BEV are considered more important than the mileage of the vehicle.

It is desirable to provide a method and system for determining the health of a preowned BEV battery system prior to purchase.

BRIEF DESCRIPTION OF THE DRAWINGS

A detailed description is set forth below with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

Figure 1:
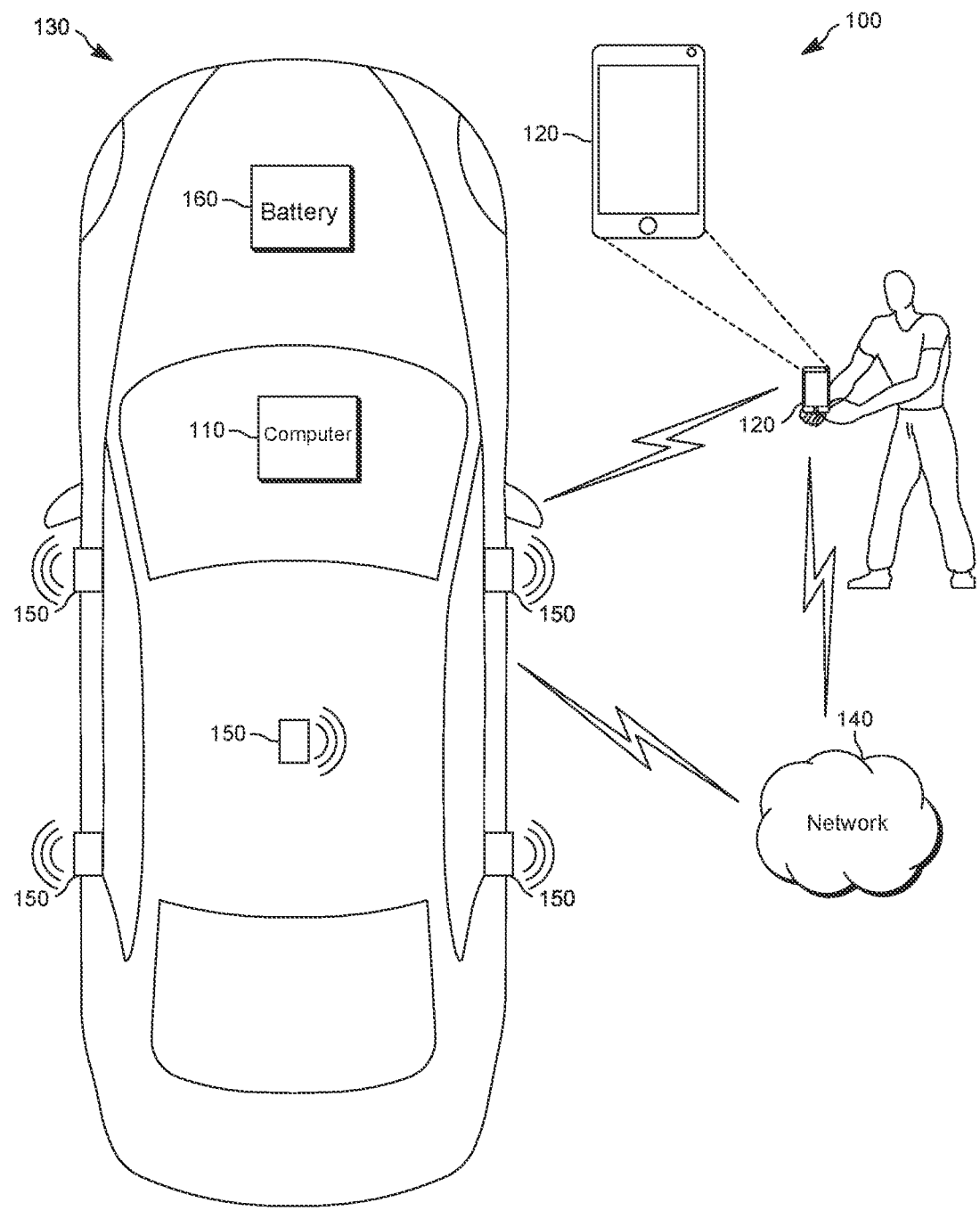
FIG. 1 illustrates an example electrified vehicle in accordance with an embodiment of the disclosure.

In terms of a general overview, this disclosure is generally directed to systems and methods for a preowned battery electric vehicle purchase advisor. More specifically, this disclosure is related to providing a system and methods for a preowned electrified vehicle battery advisor based on history of the battery electric vehicle (BEV) and driver behaviors. The preowned electrified vehicle can include a hybrid vehicle or full electric vehicle, or any vehicle wherein the life cycle of batteries are a component of the propulsion system.

In one or more embodiments, a method for battery life cycle prediction of a preowned electrified vehicle includes receiving state of charge (SOC) and mileage data associated with the preowned electrified vehicle, providing one or more driving maneuvers to be performed by a driver, providing one or more instructions to the driver to operate power-driven accessories of the preowned electrified vehicle, collecting data representing battery usage by monitoring the driving maneuvers and the operation of power-driven accessories as performed by the driver, and, responsive to the collected data representing battery usage and the SOC and mileage, providing a battery life prediction for the preowned electrified vehicle.

In one or more embodiments, the receiving SOC and mileage data associated with the preowned electrified vehicle includes scanning a matrix bar code, quick response (QR) code, or barcode to obtain vehicle identification number (VIN) historical data. The method further includes receiving data associated with prior driving habits of the driver, and providing the one or more driving maneuvers to simulate the prior driving habits of the driver of the preowned electrified vehicle. The receiving data associated with prior driving habits of the driver, in one embodiment includes receiving data from a database associated with a vehicle driven by the driver.

In one or more embodiments, the method includes providing the battery life prediction as adjusted further based on future intended use of the preowned electrified vehicle including one or more of towing, heavy payload use, bi-directional uses, power intensive environmental use, and jobsite specific use. In some embodiments, the collecting data representing battery usage by the driver by monitoring the driving maneuvers and the operation of power-driven accessories as performed by the driver includes collecting at least two sets of data during a cycle test drive of the preowned electrified vehicle. For example, in some embodiments, the collecting at least two sets of data during the cycle test drive includes collecting a plurality of data over a period of days.

In one or more embodiments, providing a battery life prediction for the preowned electrified vehicle includes receiving data collected from one or more prior test drives of the preowned electrified vehicle, the one or more prior test drives at a plurality of battery life cycle stages, and providing the battery life prediction based on at least the collected data from the one or more prior test drives. For example, in an embodiment, the providing the battery life prediction for the preowned electrified vehicle includes providing a model battery life including alternative predictions based on modified driving behaviors.

In one or more embodiments the method further includes receiving input indicative of the driver's willingness to modify driving behaviors to extend battery life of the preowned electrified vehicle, receiving a battery life goal based on the received input, providing one or more alerts based on monitored driving behavior when a detected driving behavior will result in a failure to meet the battery life goal, and providing a suggestion with the one or more alerts, the suggestion including one or more of avoiding full discharges, increase battery charging frequency, lowering a peak charge, avoiding a full charge, and reducing operating temperature.

Another embodiment is directed to a method for battery life cycle prediction and modification for an electrified vehicle, and includes collecting data representing battery usage by the driver by monitoring one or more driving behaviors and operation of power-driven accessories as performed by the driver, and responsive to the collected data representing battery usage providing a battery life prediction for the preowned electrified vehicle, providing one or more alerts based on the monitored driving behavior when a detected driving behavior will result in a failure to meet a predetermined battery life goal, and providing a suggestion with the one or more alerts, the suggestion including one or more of avoiding full discharges, increase battery charging frequency, lowering a peak charge, avoiding a full charge, and reducing operating temperature. The collected data may be stored in a database via one or more of a vehicle network, a cloud-based network, a cellular network, and a local device.

Illustrative Embodiments

The disclosure will be described more fully hereinafter with reference to the accompanying drawings, in which example embodiments of the disclosure are shown. This disclosure may, however, be embodied in many different forms and should not be construed as limited to the example embodiments set forth herein. It will be apparent to persons skilled in the relevant art that various changes in form and detail can be made to various embodiments without departing from the spirit and scope of the present disclosure. Thus, the breadth and scope of the present disclosure should not be limited by any of the above-described example embodiments but should be defined only in accordance with the following claims and their equivalents. The description below has been presented for the purposes of illustration and is not intended to be exhaustive or to be limited to the precise form disclosed. It should be understood that alternative implementations may be used in any combination desired to form additional hybrid implementations of the present disclosure. For example, any of the functionality described with respect to a particular device or component may be performed by another device or component. Furthermore, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments.

It should also be understood that the word "example" as used herein is intended to be non-exclusionary and non-limiting in nature. Furthermore, certain words and phrases that are used herein should be interpreted as referring to various objects and actions that are generally understood in various forms and equivalencies by persons of ordinary skill in the art. For example, the word "application" or the phrase "software application" as used herein with respect to a mobile device such as a smartphone, refers to code (software code, typically) that is installed in the mobile device. The code may be launched and operated via a human machine interface (HMI) such as a touchscreen. The word "action" may be used interchangeably with words such as "operation" and "maneuver" in the disclosure. The word "maneuvering" may be used interchangeably with the word "controlling" in some instances. The word "vehicle" as used in this disclosure can pertain to any one of various types of vehicles such as cars, vans, sports utility vehicles, trucks, electrified vehicles, gasoline vehicles, hybrid vehicles, and autonomous vehicles. Phrases such as "automated vehicle," "autonomous vehicle," and "partially-autonomous vehicle" as used in this disclosure generally refer to a vehicle that can perform at least some operations without a driver being seated in the vehicle.

The Society of Automotive Engineers (SAE) defines six levels of driving automation ranging from Level 0 (fully manual) to Level 5 (fully autonomous). These levels have been adopted by the U.S. Department of Transportation. Level 0 (L0) vehicles are manually controlled vehicles having no driving related automation. Level 1 (L1) vehicles incorporate some features, such as cruise control, but a human driver retains control of most driving and maneuvering operations. Level 2 (L2) vehicles are partially automated with certain driving operations such as steering, braking, and lane control being controlled by a vehicle computer. The driver retains some level of control of the vehicle and may override certain operations executed by the vehicle computer. Level 3 (L3) vehicles provide conditional driving automation but are smarter in terms of having an ability to sense a driving environment and certain driving situations. Level 4 (L4) vehicles can operate in a self-driving mode and include features where the vehicle computer takes control during certain types of equipment failures. The level of human intervention is very low. Level 5 (L5) vehicles are fully autonomous vehicles that do not involve human participation.

FIG. 1 illustrates an example system 100 that includes a mobile device 120 configured to communicate with a vehicle 130 in accordance with an embodiment of the disclosure. The vehicle 130 may be one of various types of electrified vehicles such as an electric vehicle, a hybrid electric vehicle, or an autonomous vehicle, that is configured as a Level 2 or higher automated or semi-automated vehicle. In one or more embodiments, vehicle 130 is a preowned vehicle with at least one battery 160. The system 100 may be implemented in a variety of ways and can include various types of devices. For example, the example system 100 can include some components that are a part of the vehicle 130, some components that may be carried out by a user of mobile device 120, and, in some embodiments, other components that are accessible via a communications network 140. The components that can be a part of the vehicle 130 can include a vehicle computer 110, and a wireless communication system in communication with the vehicle computer 110. Mobile device 120 may include a smartphone, a display key fob, a tablet computer, such as an iPad®, or the like.

The vehicle computer 110 may perform various functions such as controlling engine operations (fuel injection, speed control, emissions control, braking, etc.), managing climate controls (air conditioning, heating etc.), activating airbags, and issuing warnings (check engine light, bulb failure, low tire pressure, vehicle in a blind spot, etc.).

The vehicle computer 110, in one or more embodiments, may be used to support features such as passive keyless operations, vehicle maneuvering operations, and vehicle monitoring operations. Vehicle computer 110, in combination with mobile device 120, in one or more embodiments, may execute certain operations associated with receiving vehicle maneuvering and/or vehicle monitoring to enable battery life predictions in accordance with the disclosure.

The wireless communication system may include a set of wireless communication nodes 150 mounted upon vehicle 130 in a manner that allows the vehicle computer 110 to communicate with devices such as the mobile device 120 and monitor movements of vehicle 130 and environments surrounding vehicle 130. Examples of wireless communication nodes 150 may include sensors and/or emitters capable of detecting objects, distances such as radar, LiDAR, cameras, and the like. In one or more embodiments, wireless communications nodes 150 include one or more of ultrasonic, radar, LiDAR, Bluetooth®, or Bluetooth low energy (BLE). Further, in one or more embodiments, wireless communication node data is enhanced or substituted with cloud-based network data communicated to vehicle 130. In an alternative implementation, a single wireless communication node 150 may be mounted upon the roof of the vehicle 130. The wireless communication system may use one or more of various wireless technologies such as Bluetooth®, Ultra-Wideband (UWB), Wi-Fi, ZigBee®, Li-Fi (light-based communication), audible communication, ultrasonic communication, or near-field-communications (NFC), Bluetooth low energy (BLE), for carrying out wireless communications with devices such as the mobile device 120.

The vehicle computer 110, and the mobile device 120 may connect via the communications network 140 or be connected directly using a cable or the like. The communications network 140 may include any one network, or a combination of networks, such as a local area network (LAN), a wide area network (WAN), a telephone network, a cellular network, a cable network, a wireless network, and/or private/public networks such as the Internet and cloud networks. For example, the communications network 140 may support communication technologies such as TCP/IP, Bluetooth®, cellular, near-field communication (NFC), Wi-Fi, Wi-Fi direct, Li-Fi, acoustic or ultrasonic audio communication, Ultra-Wideband (UWB), machine-to-machine communication, and/or man-to-machine communication.

In one or more embodiments, communications network 140 includes a cellular or Wi-Fi communication link enabling the mobile device 120 to communicate with network 140, which may include a cloud-based network or source for transferring data in accordance with this disclosure.

A software application, as explained more fully below, may be provided in the mobile device 120, which allows a user/driver to use the mobile device 120 for performing actions of a connected vehicle such as locking and unlocking of the doors of the vehicle 130, and for monitoring actions performed by vehicle 130. In accordance the disclosure herein, monitoring can include monitoring driving behaviors such as maneuvering and the use of power-driven accessories. The mobile device 120 may communicate with the vehicle computer 110 via one or more of the first set of wireless communication nodes 150 to monitor driver behaviors and send and receive interactions with vehicle 130. For example, mobile device 120 may detect maneuvers performed by the vehicle 130 such as braking, maneuvering during city driving, long distance driving, business driving, and associate different operations with a state of charge (SOC) of the electrified vehicle at the time of the detected maneuvers.

Figure 2:
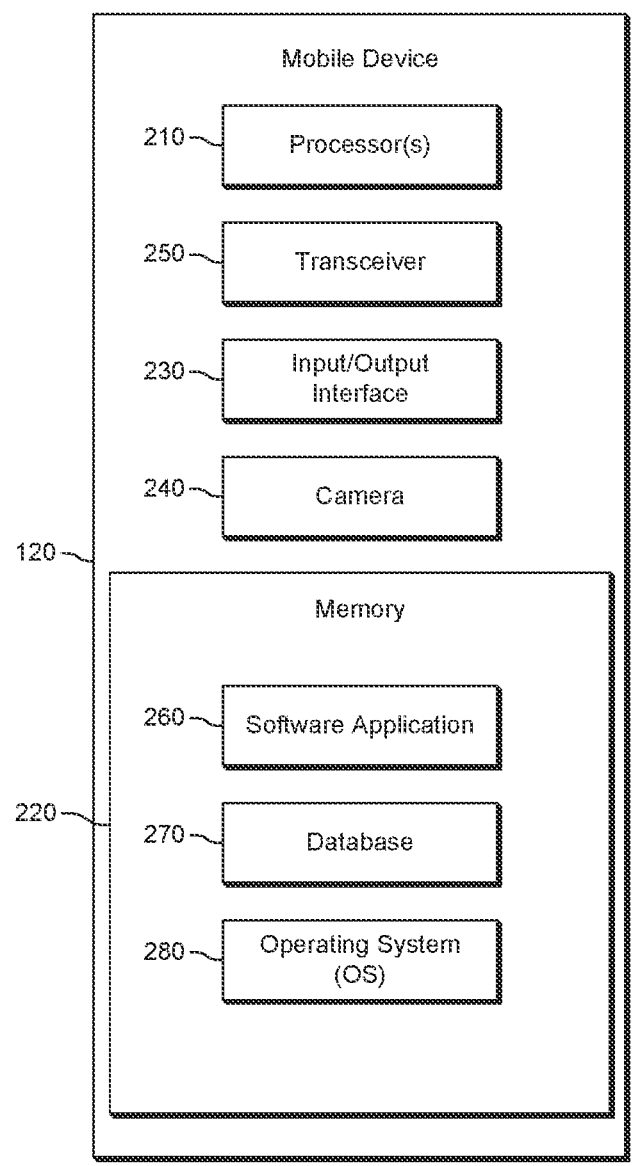
FIG. 2 illustrates some example functional blocks that may be included in a mobile device, such as a cellular phone, in accordance with an embodiment of the disclosure.

FIG. 2 illustrates some example functional blocks that may be included in the mobile device 120 in accordance with an embodiment of the disclosure. The functional blocks of the mobile device 120 may include a processor 210, memory 220, an input/output (I/O) interface 230, camera 240, which may be a stereo camera to enable an overlay display, transceiver 250, software application 260, database 270, and an operating system (OS) 280. The I/O interface 230, may include a touchscreen having softkeys (graphical icons), and a biometric component (to enable facial recognition, a fingerprint scanner, or a microphone for voice command input). Some of these components may perform functions that are integral to the mobile device 120, such as, for example, handling phone calls and running software applications downloaded from the Google Play store. The operating system 280 can be any of various kinds of software used for operating the mobile device 120 such as, for example, an iOS® operating system, an Android® operating system, or a Windows® operating system.

The software application 260 may be a software application that is downloaded into the mobile device 120 from an app store. In one or more embodiments, the software application 260 is an electrified vehicle battery life prediction software application that tracks driving behaviors, state of charge (SOC) and mileage of a vehicle. One example of a software application is Ford Pass®. The software application may be used to carry out various battery life predictive modeling operations such as, for example, for a driver test driving a preowned electrified vehicle.

In one or more embodiments, software application 260 operates to carry out various actions for enabling a predictive modeling of battery life by synchronizing the mobile device 120 to a vehicle, such as vehicle 130.

The transceiver 250 can include a wireless transmitter and/or a wireless receiver that is used to communicate with a transceiver in the vehicle 130. The communications may be carried out by using any of various wireless formats such as, for example, Bluetooth®, Ultra-Wideband (UWB), Wi-Fi, ZigBee®, Li-Fi (light-based communication), audible communication, and ultrasonic communication. The transceiver 250 may be coupled to various components in the vehicle 130, such as, for example, a system for in-vehicle communications (displaying messages, providing warnings, etc.) and in some embodiments also be coupled to wireless communication nodes 150 for monitoring different maneuvers performed by vehicle 130.

The computer 110 in the vehicle 130 may be configured to operate in cooperation with the software application 260 in mobile device 120 to execute various operations associated with predicting battery life of vehicle 130 by transmitting vehicle 130 information about prior historical driving behaviors performed by a driver, who may own mobile device 120 but be test driving vehicle 130 in accordance with one or more embodiments.

The memory 220, which is one example of a non-transitory computer-readable medium, may be used to store the operating system (OS) 280, database 270, and various modules such as the software application 260. One or more modules in the form of computer-executable instructions may be executed by the processor 210 for performing various operations in accordance with the disclosure. More particularly, software application 260 may be executed by the processor 210 for synchronizing mobile device to vehicle 130 to enable battery life predictions of a battery 160 within vehicle 130.

In an exemplary embodiment, vehicle 130 is a preowned vehicle that a driver wants to test drive. In an embodiment, the driver desires to know the history of vehicle 130 and the state of the batteries. Further, the driver desires to know a prediction of the longevity of the batteries in vehicle 130 prior to purchase or after a purchase.

According to an embodiment, a driver of vehicle 130, uses the mobile device 120, which may be a cellular device, such as an Android, an iPhone®, or other handheld device, and may connect a software application 260, such as a battery electrified vehicle (BEV) Purchase Advisor, to test and evaluate vehicle 130. In one or more embodiments, connecting the software application can include entering a vehicle identification number (VIN) and a battery size. In one embodiment, entering information can include using software application 260 to scan a barcode, such a quick response (QR) code to obtain access to VIN historical data if previously authorized by a vehicle's owner.

In an embodiment, a driver links mobile device 120 to vehicle 130 and connects to state of charge (SOC) data and mileage data from vehicle 130, which can be done manually or via an application.

In an embodiment, driver owns the mobile device 120, such as an iPhone®, that has a Ford Pass® application that is coupled to software application 260. Ford Pass® or other application may store the driver's typical driving behavior in a database or in a cloud storage and provide the historical driving behavior to software application 260. In one embodiment, the software application 260 uses the stored driving behavior to determine specific driving maneuvers that match the driver's profile stored in the Ford Pass® application or other application.

In an embodiment, software application 260 assists the driver in predicting the future life of preowned vehicle 130 during a test drive by instructing and guiding the driver during a test drive by using the historical driving behavior to get an accurate picture of how vehicle 130 would perform. For example, software application 260 may instruct the driver to make targeted specific driving maneuvers based on the historical driving behavior, such as accelerating and braking. Software application 260 further may indicate to the driver to turn on multiple accessories in the preowned vehicle 130, such as using the heater, air conditioning and accessories that drive power usage.

In one embodiment, if preowned vehicle 130 is to be used for frequent towing, heavy payload, or is to be used on a jobsite or in an environment with mountains or with bi-directional power utilization, software application 260 adjusts battery life predictions by estimating the impact of the extra use as compared to a manufacturer's published battery life expectancy. Such heavy use may also be included in maneuvers for estimating likely battery life and performance.

In one embodiment, software application 260 monitors that the driver is following the correct test driving profile by relying on the mobile device internal sensors such as an accelerometer, gyroscope, temperature sensor and the like. Alternatively, software application 260 via mobile device 120 is coupled to vehicle 130, and uses vehicle sensors 150 to monitor driver behavior. Alternatively, software application 260 can query a driver to provide feedback.

For example, software application 260 can allow a driver to confirm or deny that sensor data matches historical driving behavior by providing feedback as needed. Further, software application 260 can state to the driver, "You usually accelerate harder and brake more suddenly ... you may not be driving as you normally would" or "perhaps someone else drove your vehicle differently" to get correct data.

In an embodiment, software application 260 collects the driving data from the test drive to perform a prediction. In one embodiment, the data is collected at two different points during a testing cycle. If the test driving is done over a period of days, the battery life cycle can cover different ranges of the battery charge and discharge cycles and different driving behaviors.

Thus, software application 260 can provide specific driving maneuvers created for the driver to enable software application 260 to calculate a projected battery life based on the driver's own historical driving behavior.

In one or more embodiments, software application 260 may optionally provide a driver with an option to input that they are willing to modify their driving behavior to extend the life of the battery. Software application 260 can then provide a set of maneuvers that exemplify the types of driving behaviors necessary to extend battery life.

Thus, software application 260 may be implemented as an application that operates after a purchase of a preowned vehicle or a new vehicle that continues to give a driver alerts when their behavior is not meeting their goals to extend battery life. Thus, in some embodiments, alerts can include alerts to avoid a full discharge since the smaller the discharge of the battery, the longer the battery will last. Another alert may include a directive to charge the battery more often between uses to keep the battery from fully discharging. Another alert may include keeping the charge below 100% as a state of charge (SOC) to keep a lower peak charge. Another alert may be to reduce operating temperature, such as a reminder to park vehicle 130 in a cool place.

In some embodiments, the alerts may synchronize vehicle 130 with the software application 260. For example, if software application 260 is synchronized with vehicle 130, the application may modify battery cooling algorithms by running pumps/fans to keep the battery cooler and thereby extend battery life.

Figure 3:
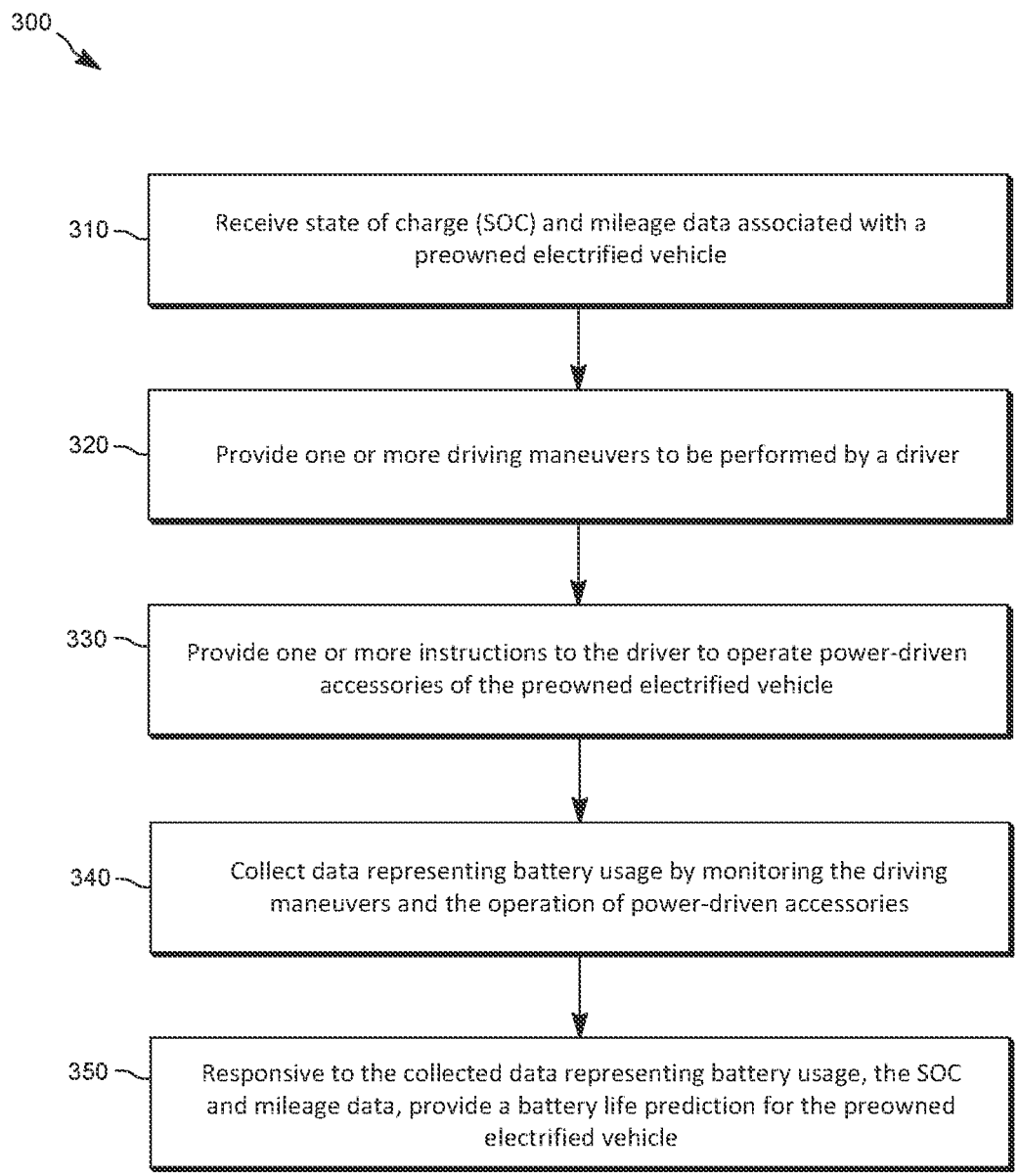
FIG. 3 illustrates a flow diagram of a method in accordance with an embodiment of the disclosure.

Referring to FIG. 3, a flow diagram 300 illustrates a method in accordance with an embodiment of the disclosure. As shown, block 310 provides for receiving state of charge (SOC) and mileage data associated with a preowned electrified vehicle. For example, the mobile device 120 may scan a barcode or quick response (QR) matrix barcode associated with vehicle 130 or a driver may enter a Vehicle identification number (VIN) or other source of data associated with vehicle 130.

Block 320 continues the flow diagram of the method by providing one or more driving maneuvers to be performed by a driver. For example, in an embodiment, a driver that owns mobile device 120 may have Ford Pass® or another software application that monitors how he/she drives over time, and software application 260 may operate as a test driving application, to provide driving maneuvers that demonstrate how the driver drives historically for purposes of a test drive to simulate the prior driving habits of the driver of the preowned electrified vehicle. In one embodiment, the driving maneuvers are based on received data associated with prior driving habits of the driver. For example, software application can receive data from a database associated with a vehicle usually driven by the driver or the like to determine maneuvers appropriate for test driving vehicle 130.

Block 330 continues the method by providing one or more instructions to the driver to operate power-driven accessories of the preowned electrified vehicle. For example, in one embodiment, software application 260 performs a predictive battery life modeling for preowned electrified vehicle 130, and tests the battery discharge when accessories are operating.

Block 340 provides for collecting data representing battery usage by monitoring the driving maneuvers and the operation of power-driven accessories. For example, software application 260 in combination with vehicle 130 may use hardware inside mobile device 120 or sensors 150 on vehicle 130 to monitor maneuvers directed to a driver to perform for battery life predictions. Additionally, software application 260 can monitor operation of power-driven accessories such as air conditioning and other vehicle accessories that draw battery power to estimate how the accessories affect battery life during a test drive of vehicle 130.

In one embodiment, collecting data representing battery usage includes collecting at least two sets of data during a cycle test drive of the preowned electrified vehicle. For example, the collecting data can include collecting at least two sets of data during a cycle test drive. In one embodiment, the collecting data can be over a period of days. For example, a test drive can last for a number of days enabling at least one battery cycle to occur during the testing period.

In another embodiment, collecting data can include receiving data collected from one or more prior test drives of the preowned electrified vehicle 130. Thus, the collected data can include prior test drives if software application 260 has access to such data.

Block 350 provides that, responsive to the collected data representing battery usage, the SOC, and mileage data, providing a battery life prediction for the preowned electrified vehicle. For example, in one embodiment, software application 260 collects data from sensor nodes 150, and data transmitted to mobile device 120 to provide historical VIN-related data and mileage and historical SOC data, such as manufacturer-provided data concerning the battery installed in preowned vehicle 130. Additionally, software application 260 may collect data based on the maneuvers and operation of power-driven accessories and combine the collected data to provide a battery life prediction. In one embodiment, the battery life prediction is based on at least the collected data from the one or more prior test drives.

In one embodiment, providing the battery life prediction may be adjusted further based on future intended use of the preowned electrified vehicle including one or more of towing, heavy payload use, bi-directional uses, power intensive environmental use, and jobsite specific use.

In another embodiment, providing a model battery life includes alternative predictions based on modified driving behaviors. For example, software application 260 may receive input indicative of the driver's willingness to modify driving behaviors to extend battery life of the preowned electrified vehicle 130, and provide one or more alerts based on monitored driving behavior when a detected driving behavior will result in a failure to meet the battery life goal.

For example, if a driver provides software application 260 with a battery life goal, software application may provide a suggestion with the one or more alerts, the suggestion including one or more of avoiding full discharges, increase battery charging frequency, lowering a peak charge, avoiding a full charge, and reducing operating temperature.

Figure 4:
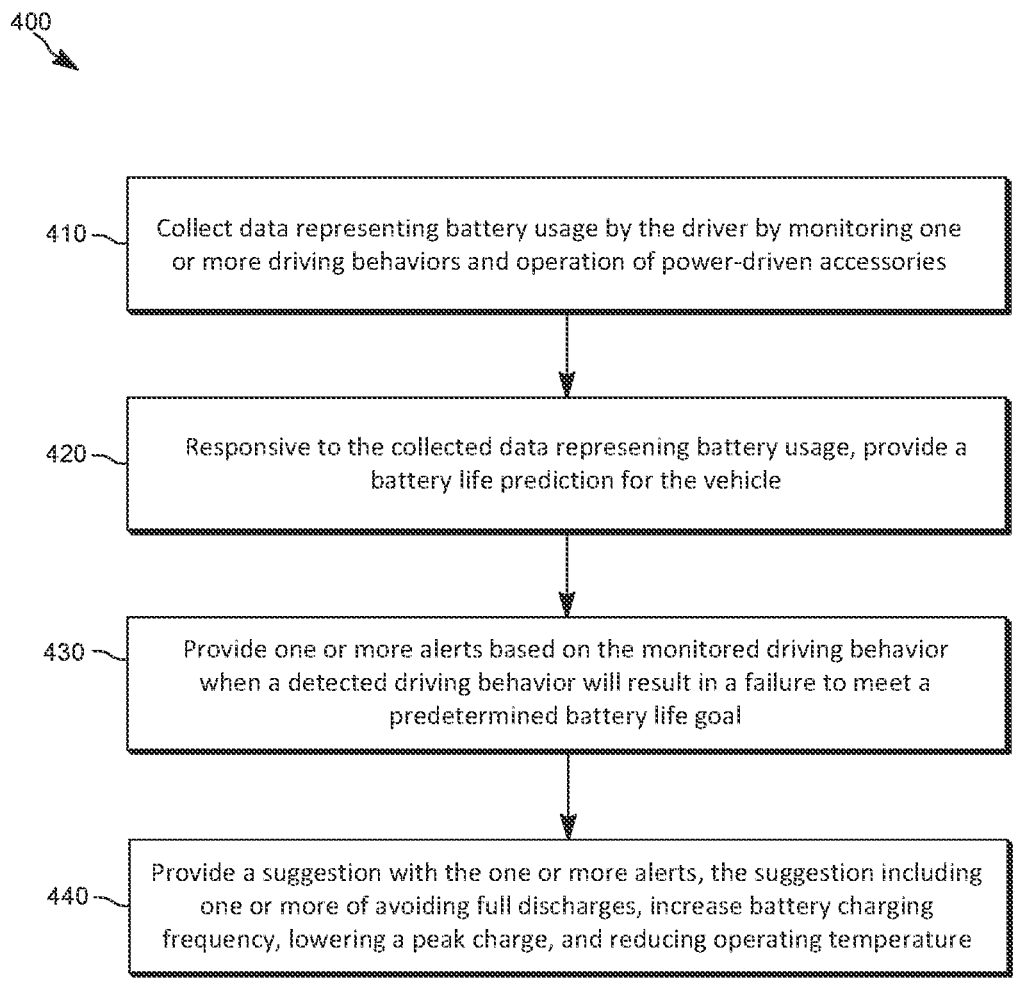
FIG. 4 illustrates another flow diagram of a method in accordance with an embodiment of the disclosure.

Referring now too FIG. 4, a flow diagram 400 illustrates another method in accordance with an embodiment. More particularly, one embodiment is directed to a battery life prediction application such as software application 260 that can be used with a driver's vehicle on a permanent basis. For example, if vehicle 130 is purchased by the driver who owns mobile device 130, the previous prediction determined during a test drive period can be extended.

Block 410 provides for collecting data representing battery usage by the driver by monitoring one or more driving behaviors and the operation of power-driven accessories. For example, software application 260 can collect ongoing battery usage data by a driver of vehicle 130 after purchasing. The collected data can include ongoing operation of power driven accessories.

Figure 5:
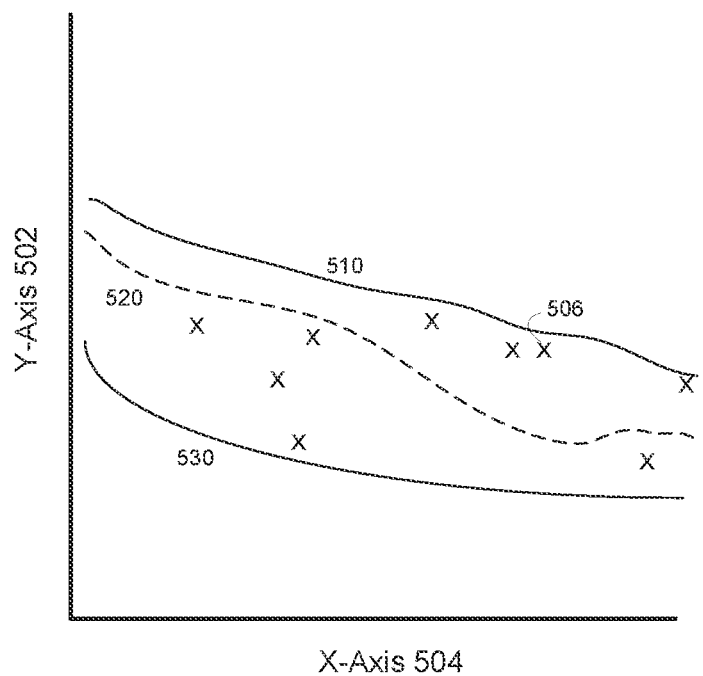
FIG. 5 illustrates an exemplary graph predictive of battery life of an electrified vehicle in accordance with an embodiment of the disclosure.

Block 420 provides that responsive to the collected data representing battery usage, providing a battery life prediction for the vehicle. For example, referring to FIG. 5 a battery life prediction can include a model outlining future battery life. As shown in FIG. 5 illustrates a Y axis 502 that can represent a state of health of a battery and an X axis 504 that can indicate time over the life of a battery. FIG. 5 illustrates points on the graph 506 that can be plotted over time. Different predictive lines, 510, 520 and 530 can plot the points with best case 510, actual case 520 and worst case 530 scenarios for battery life.

Referring back to FIG. 4, in one embodiment, a driver may want to increase the potential battery life to match line 510 and be open to receiving alerts when driving or battery usage negates a best case scenario. Thus, block 430 illustrates providing one or more alerts based on the monitored driving behavior when a detected driving behavior will result in a failure to meet a predetermined battery life goal.

Block 440 illustrates providing a suggestion with the one or more alerts, the suggestion including one or more of avoiding full discharges, increase battery charging frequency, lowering a peak charge, and reducing operating temperature. For example, if a monitored driver behavior includes how often a driver charges vehicle 130, software application 260 may suggest charging more often and not charging fully unless a long trip is planned.

In one embodiment, the method further includes storing the collected data in a database via one or more of a vehicle network, a cloud-based network, a cellular network, and a local device. For example, the collected data can include driving behaviors for a user of software application 260 to apply to other vehicles when a current vehicle is no longer in use, but the behaviors are useful for test driving a potential newer vehicle.

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," "an example embodiment," "example implementation," etc., indicate that the embodiment or implementation described may include a particular feature, structure, or characteristic, but every embodiment or implementation may not necessarily include the particular feature, structure, or characteristic. Moreover, such phrases are not necessarily referring to the same embodiment or implementation. Further, when a particular feature, structure, or characteristic is described in connection with an embodiment or implementation, one skilled in the art will recognize such feature, structure, or characteristic in connection with other embodiments or implementations whether or not explicitly described. For example, various features, aspects, and actions described above with respect to an autonomous parking maneuver are applicable to various other autonomous maneuvers and must be interpreted accordingly.

Implementations of the systems, apparatuses, devices, and methods disclosed herein may comprise or utilize one or more devices that include hardware, such as, for example, one or more processors and system memory, as discussed herein. An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or any combination of hardwired or wireless) to a computer, the computer properly views the connection as a transmission medium. Transmission media can include a network and/or data links, which can be used to carry desired program code means in the form of computer-executable instructions or data structures and which can be accessed by a general purpose or special purpose computer. Combinations of the above should also be included within the scope of non-transitory computer-readable media.

Computer-executable instructions comprise, for example, instructions and data which, when executed at a processor, cause the processor to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

A memory device can include any one memory element or a combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory device may incorporate electronic, magnetic, optical, and/or other types of storage media. In the context of this document, a "non-transitory computer-readable medium" can be, for example but not limited to, an electronic, magnetic, optical, electromagnetic, infrared, or semiconductor system, apparatus, or device. More specific examples (a non-exhaustive list) of the computer-readable medium would include the following: a portable computer diskette (magnetic), a random-access memory (RAM) (electronic), a read-only memory (ROM) (electronic), an erasable programmable read-only memory (EPROM, EEPROM, or Flash memory) (electronic), and a portable compact disc read-only memory (CD ROM) (optical). Note that the computer-readable medium could even be paper or another suitable medium upon which the program is printed, since the program can be electronically captured, for instance, via optical scanning of the paper or other medium, then compiled, interpreted or otherwise processed in a suitable manner if necessary, and then stored in a computer memory.

Those skilled in the art will appreciate that the present disclosure may be practiced in network computing environments with many types of computer system configurations, including in-dash vehicle computers, personal computers, desktop computers, laptop computers, message processors, mobile devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by any combination of hardwired and wireless data links) through a network, both perform tasks. In a distributed system environment, program modules may be located in both the local and remote memory storage devices.

Further, where appropriate, the functions described herein can be performed in one or more of hardware, software, firmware, digital components, or analog components. For example, one or more application specific integrated circuits (ASICs) can be programmed to carry out one or more of the systems and procedures described herein. Certain terms are used throughout the description, and claims refer to particular system components. As one skilled in the art will appreciate, components may be referred to by different names. This document does not intend to distinguish between components that differ in name, but not function.

At least some embodiments of the present disclosure have been directed to computer program products comprising such logic (e.g., in the form of software) stored on any computer-usable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described example embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

That which is claimed is:

1. A method for battery life cycle prediction for an electrified vehicle, comprising:
   receiving state of charge (SOC) and mileage data associated with the electrified vehicle;
   providing one or more driving maneuvers to be performed by a driver;
   providing one or more instructions to the driver to operate power-driven accessories of the electrified vehicle;
   collecting data representing battery usage by monitoring the driving maneuvers and operation of power-driven accessories as performed by the driver; and
   responsive to the collected data representing battery usage, the SOC and mileage data, providing a battery life prediction for the electrified vehicle.

2. The method of claim 1, wherein the receiving SOC and mileage data associated with the electrified vehicle further comprises:
   scanning a matrix bar code, quick response (QR) code, or barcode to obtain vehicle identification number (VIN) historical data.

3. The method of claim 1, further comprising:
receiving data associated with prior driving habits of the driver; and
providing the one or more driving maneuvers to simulate the prior driving habits of the driver of the electrified vehicle.

4. The method of claim 3, wherein the receiving data associated with prior driving habits of the driver further comprises:
receiving data from a database associated with a vehicle driven by the driver.

5. The method of claim 1, further comprising:
providing the battery life prediction as adjusted further based on future intended use of the electrified vehicle including one or more of towing, heavy payload use, bi-directional uses, power intensive environmental use, and jobsite specific use.

6. The method of claim 1, wherein the collecting data representing battery usage by the driver by monitoring the driving maneuvers and operation of power-driven accessories as performed by the driver further comprises:
collecting at least two sets of data during a cycle test drive of the electrified vehicle.

7. The method of claim 6, wherein the collecting at least two sets of data during the cycle test drive includes collecting a plurality of data over a period of days.

8. The method of claim 1, wherein providing the battery life prediction for the electrified vehicle further comprises:
receiving data collected from one or more prior test drives of the electrified vehicle, the one or more prior test drives at a plurality of battery life cycle stages; and
providing the battery life prediction based on at least the collected data from the one or more prior test drives.

9. The method of claim 1, wherein the providing the battery life prediction for the electrified vehicle further comprises:
providing a model battery life including alternative predictions based on modified driving behaviors.

10. The method of claim 1, further comprising:
receiving input indicative of a willingness of the driver to modify driving behaviors to extend battery life of the electrified vehicle;
receiving a battery life goal based on the received input; and
providing one or more alerts based on monitored driving behavior when a detected driving behavior will result in a failure to meet the battery life goal.

11. The method of claim 10, further comprising:
providing a suggestion with the one or more alerts, the suggestion including one or more of avoiding full discharges, increase battery charging frequency, lowering a peak charge, avoiding a full charge, and reducing operating temperature.

12. A system for a mobile device, comprising:
a memory that stores computer-executable instructions; and
a processor configured to access the memory and execute the computer-executable instructions to:
receive state of charge (SOC) and mileage data associated with a preowned electrified vehicle;
provide one or more driving maneuvers to be performed by a driver;
provide one or more instructions to the driver to operate power-driven accessories of the preowned electrified vehicle;
collect data representing battery usage by the driver by monitoring the driving maneuvers and operation of power-driven accessories as performed by the driver; and
responsive to the collected data representing battery usage and the SOC and mileage, provide a battery life prediction for the preowned electrified vehicle.

13. The system of claim 12, wherein the processor configured to access the memory and execute the computer-executable instructions is further configured to:
scan a matrix bar code, quick response (QR) code, or barcode to obtain vehicle identification number (VIN) historical data.

14. The system of claim 12, wherein the processor configured to access the memory and execute the computer-executable instructions is further configured to:
receive data associated with prior driving habits of the driver; and
provide the one or more driving maneuvers to simulate the prior driving habits of the driver of the preowned electrified vehicle.

15. The system of claim 12, wherein the processor configured to access the memory and execute the computer-executable instructions is further configured to:
provide the battery life prediction as adjusted further based on future intended use of the preowned electrified vehicle including one or more of towing, heavy payload use, bi-directional uses, power intensive environmental use, and jobsite specific use.

16. The system of claim 12, wherein the processor configured to access the memory and execute the computer-executable instructions is further configured to:
receive data collected from one or more prior test drives of the preowned electrified vehicle, the one or more prior test drives at a plurality of battery life cycle stages; and
provide the battery life prediction based on at least the collected data from the one or more prior test drives.

17. The system of claim 12, wherein the processor configured to access the memory and execute the computer-executable instructions is further configured to:
receive input indicative of a willingness of the driver to modify driving behaviors to extend battery life of the preowned electrified vehicle;
receive a battery life goal based on the received input; and
provide one or more alerts based on monitored driving behavior when a detected driving behavior will result in a failure to meet the battery life goal.

18. The system of claim 17, wherein the processor configured to access the memory and execute the computer-executable instructions is further configured to:
provide a suggestion with the one or more alerts, the suggestion including one or more of avoiding full discharges, increase battery charging frequency, lowering a peak charge, avoiding a full charge, and reducing operating temperature.

19. A method for battery life cycle prediction and modification for an electrified vehicle comprising:
collecting data representing battery usage by a driver by monitoring one or more driving behaviors and operation of power-driven accessories as performed by the driver; and
responsive to the collected data representing battery usage, providing a battery life prediction for the electrified vehicle;

providing one or more alerts based on the monitored driving behavior when a detected driving behavior will result in a failure to meet a predetermined battery life goal; and provide a suggestion with the one or more alerts, the suggestion including one or more of avoiding full discharges, increase battery charging frequency, lowering a peak charge, avoiding a full charge, and reducing operating temperatures.

20. The method of claim 19, further comprising:

storing the collected data in a database via one or more of a vehicle network, a cloud-based network, a cellular network, and a local device.

\* \* \* \* \*